United States Patent [19]
Lee

[11] Patent Number: 5,543,340
[45] Date of Patent: Aug. 6, 1996

[54] METHOD FOR MANUFACTURING OFFSET POLYSILICON THIN-FILM TRANSISTOR

[75] Inventor: Joo-hyung Lee, Seoul, Rep. of Korea

[73] Assignee: Samsung Electronics Co., Ltd., Suwon, Rep. of Korea

[21] Appl. No.: 363,201

[22] Filed: Dec. 27, 1994

[30]    Foreign Application Priority Data

Dec. 28, 1993 [KR] Rep. of Korea ............... 93-30232

[51] Int. Cl.$^6$ .................................................. H01L 21/336
[52] U.S. Cl. ........................... 437/44; 437/192; 437/200; 148/DIG. 147
[58] Field of Search .................. 437/41, 44, 192, 437/200; 148/DIG. 147; 257/336

[56]            References Cited

U.S. PATENT DOCUMENTS

| | | | |
|---|---|---|---|
| 4,908,326 | 3/1990 | Ma et al. | 437/44 |
| 4,971,922 | 11/1990 | Watabe et al. | 437/44 |

FOREIGN PATENT DOCUMENTS

| | | | |
|---|---|---|---|
| 59-104167 | 6/1984 | Japan | 437/44 |
| 60-113472 | 6/1985 | Japan | 437/44 |
| 1-291463 | 11/1989 | Japan | 437/44 |
| 2-177442 | 7/1990 | Japan | 437/44 |
| 2-254729 | 10/1990 | Japan | 437/44 |
| 2-304934 | 12/1990 | Japan | 437/44 |
| 2-304935 | 12/1990 | Japan | 437/44 |
| 3-250632 | 11/1991 | Japan | 437/44 |
| 6-37106 | 2/1994 | Japan | 437/44 |
| 6-132300 | 5/1994 | Japan | 437/44 |

*Primary Examiner*—Mary Wilczewski
*Attorney, Agent, or Firm*—Stephen R. Whitt

[57]            ABSTRACT

In a method for fabricating an offset polysilicon thin-film transistor through the formation of silicide, the width of offset regions can be controlled as a narrow width of below 1 μm. Drain voltage is decreased due to the reduction of the offset regions' width. The effect of an increased parallel resistance and a bias voltage dependency of an overlap capacitance due to the arrangement of low concentration ion region reduces leakage current and improves the response to applied voltages. Also, gate voltage is decreased due to the decreased gate resistance when the polysilicon of the gate is substituted with the silicide.

8 Claims, 3 Drawing Sheets

5,543,340

METHOD FOR MANUFACTURING OFFSET POLYSILICON THIN-FILM TRANSISTOR

BACKGROUND OF THE INVENTION

The present invention relates to a method for manufacturing a polysilicon thin-film transistor, and more particularly, to a method for forming a silicide on an offset thin-film transistor which is frequently applied to a liquid crystal display in a single body, to decease the short-channel effects of a short channel MOSFET and to reduce leakage current.

FIG. 1 is a section view of a conventional offset polysilicon thin-film transistor. The structure of the transistor shown in FIG. 1 is as follows.

A polysilicon layer 1 (active layer) is formed on the upper surface of a substrate 100. Then, a source 2 and drain 6 region each having a dopant ($n^+$) implanted therein are respectively formed on either side of the active layer, and a region 7 thereof (adjacent to each of the source and drain regions) is doped with a low concentration dopant ($n^-$) in order to decrease leakage current. A gate insulating layer 3 is formed on the upper surface of the active layer and a gate 5 is formed thereon.

A method for fabricating the offset polysilicon thin-film transistor having the above structure will be described in connection with FIG. 2.

First, a sensitie layer (photoresist) is coated over and patterned around gate 5 to form a photoresist pattern 4. Thereafter, a first ion implantation process 101, wherein a high concentration dopant ($n^+$) is implanted, is performed for forming the source and Grain regions within the active layer. Thereafter, photoresist pattern 4 is removed and another mask (not shown) is formed. Offset regions 7 ($n^-$) are formed by a second ion implantation process (not shown), wherein a low concentration dopant ($n^-$), is implanted. The second mask is then removed to complete the formation of an offset polysilicon thin-film transistor.

As described above, according to the conventional method for fabricating the offset polysilicon thin-film transistor, a photoresist pattern is formed to mask the offset regions and then the ion-implantation is performed. Here, the thickness of the photoresist, that is, the masking material, is always greater than 1 µm; here, about 1.2 µm. Thus, a width 1 of offset regions 7 is over 1 µm. Also, since the photoresist may be unevenly formed on either side of gate 5 during the coating process and the pattern-etching process after coating, the offset regions have an asymmetrical structure which causes undesirable changes the electrical characteristics of the device compared with a symmetrical structure formation.

SUMMARY OF THE INVENTION

To solve the above problem, it is an object of the present invention to provide a method for fabricating an offset polysilicon thin-film transistor, wherein the width of the offset regions can be controlled.

To achieve the above object, a method for fabricating an offset polysilicon thin-film transistor comprises the steps of: (a) forming an active layer having a channel of a predetermined width; (b) forming a gate insulating layer on the surface of the active layer; (c) forming a polysilicon gate layer on the surface of the gate insulating layer and etching to form a gate; (d) vacuum-evaporating a metal for forming silicide onto the gate and gate insulating layer and selectively etching the metal so that metal remains around the gate; (e) first ion-implanting at a high concentration using the remaining metal layer in the step (d) as a mask and forming a source and drain region on either side of the active layer; (f) causing a chemical reaction between the polysilicon gate layer and the metal layer so as to form a silicide, by a thermal treatment process; (g) removing the metal layer remaining after silicide formation in the step (f); and (h) second ion-implanting at a low concentration so as to form offset regions having a width, from the inner portions of the source and drain regions toward the channel interior, corresponding to the thickness of the metal layer removed in the step (g).

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The offset polysilicon thin-film transistor according to the present invention a adopts a principle where the volume of silicide formed is evenly expanded with a constant proportion.

Figure 1:
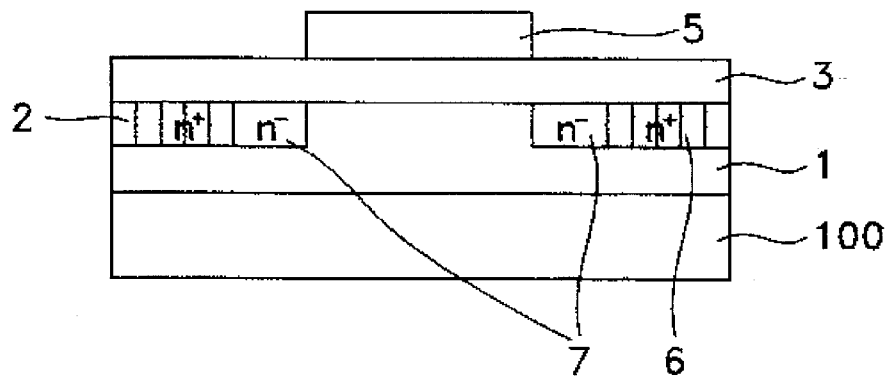
FIGS. 1 and 2 are section views for explaining a conventional offset polysilicon thin-film transistor.
Figure 2:
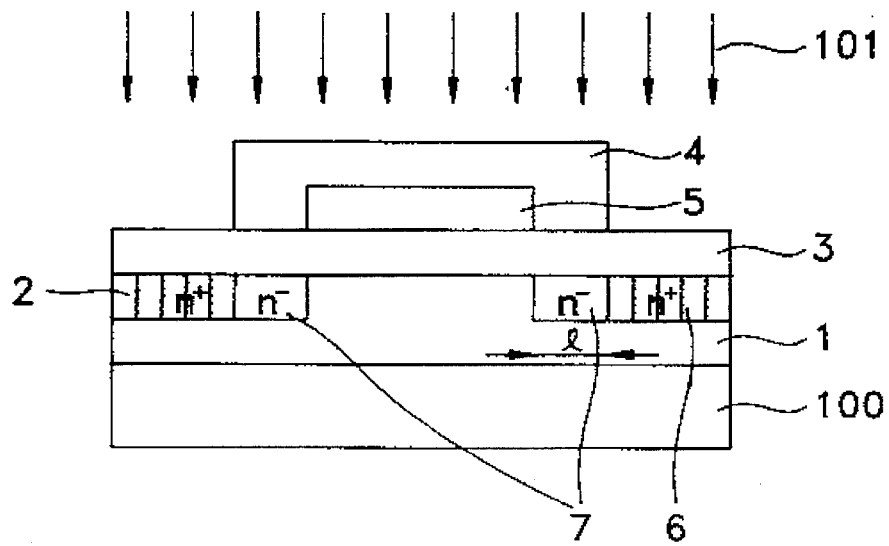
Figure 3:
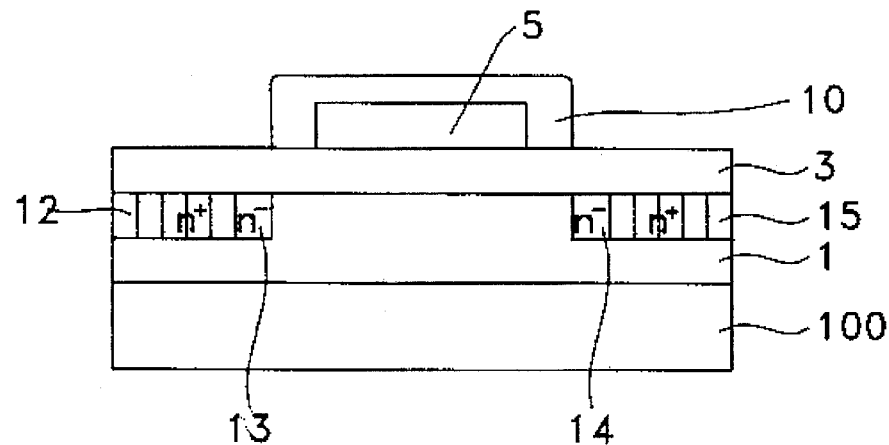
FIG. 3 is a section view of an offset polysilicon thin-film transistor according to the present invention.

First, referring to FIG. 3, the structure of the offset polysilicon thin-film transistor according to a preferred embodiment will be described.

An active layer 1 of polysilicon is formed on a substrate 100. Active layer 1 has a source 12 and drain 15 of constant widths into which a high ion concentration ($n^+$) is implanted, and offset regions 13 and 14 formed by implantation of a low ion concentration $n^-$). Here, offset regions 13 and 14 reduce leakage current. A gate insulating layer 3 is formed on the upper surface of active layer 1, and a complex gate (5 and 10) is formed on the upper surface of the gate insulating layer.

The method for fabricating an offset polysilicon thin-film transistor having the above-described structure, through a silicide formation, is as follows.

Figure 4:
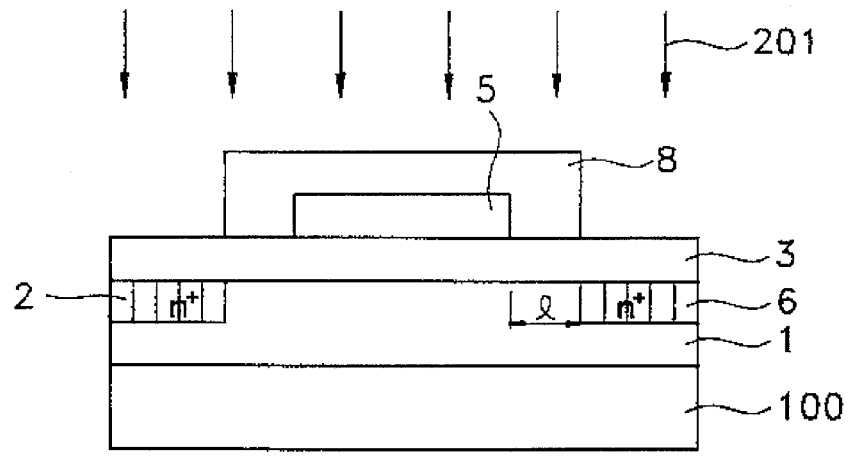
FIGS. 4–7 are secretion views showing the process steps of an offset polysilicon thin-film transistor according to the present invention.
Figure 5:
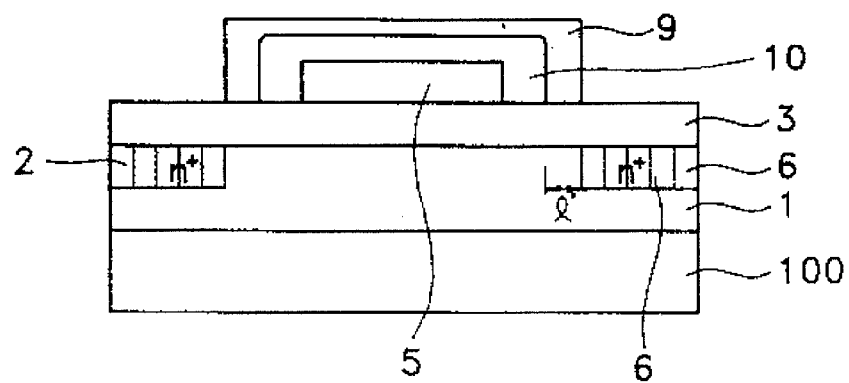

First, referring to FIG. 4 showing a step of forming a metal layer for silicide formation, an active layer 1 having a channel of a predetermined width is formed on a substrate 100, through an etching process of a polysilicon layer (not shown). The entire surface of active layer 1 is oxidized to form a gate insulating layer 3. Then, another polysilicon layer is accumulated on the gate insulating layer and etched to form gate 5. Next, a metal for forming the silicide is vacuum-evaporated onto the resultant substrate and patterned to form a metal pattern 8. Here, the thickness of the metal layer is determined based on first offset width 1 and second offset width 1' (FIG. 5) and in accordance with the characteristics of the metal used for forming the silicide. Next, a high ion concentration 201 ($n+$) is implanted to form a source and drain region on either side of the active layer, using metal pattern 8 as a mask. Referring to FIG. 5 which illustrates the step of forming silicide through thermal-treatment, the resulting substrate is thermally treated to thereby form a silicide 10 through a chemical reaction with the gate.

Figure 6:
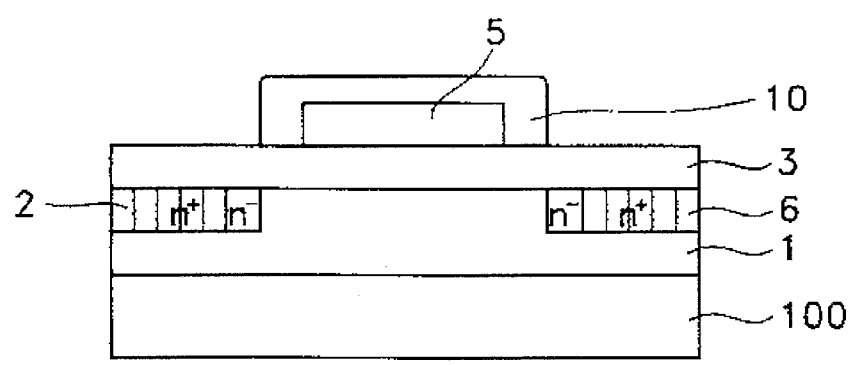

Thereafter, referring to FIG. 6 showing a step of removing the metal which remains after silicide formation, offset regions are formed from the inner portions of the source and drain regions toward the channel interior, using a low ion concentration (n⁻). Before the low concentration ion is implanted to form the offset regions, the thickness of the silicide is determined to control the width of the offset regions. Then, the thermal-treatment is performed to cause a chemical reaction between the polysilicon gate layer and the metal layer to form the silicide. Since the thickness of the silicide varies according to the thermal-treating temperature and time, the width of the offset can be controlled by the conditions used to form the silicide.

Figure 8:
FIG. 8 shows the change of composition and thicknesses of the gate and metal layers after forming silicide through a thermal-treatment process.

As shown in FIG. 6, the residual metal layer 9 remaining after formation of silicide 10 in the thermal-treatment step is removed by etching. Here, the gate is constituted by a complex structure wherein silicide is formed atop polysilicon. The silicide portion of the gate has optimum thickness when the polysilicon layer and metal layer are composed according to the thickness ratios shown in Table 1. The change of the layer's thickness in the specific case where titanium is used as a metal for forming silicide and a rapid thermal annealing is performed at 700° C. for three minutes after the thermal-treatment is performed at 700° C. for 30–60 minutes is shown in FIG. 8. Here, a change occurs in the composition and thicknesses of the gate and metal layers after forming the silicide through a thermal-treatment process. Specifically, with a titanium metal layer of 5,000 Å vacuum-evaporated onto a polysilicon layer of 5,000 Å, a silicide layer of 0.7–1.0 μm results when thermal-treatment is performed under the above conditions.

Figure 7:
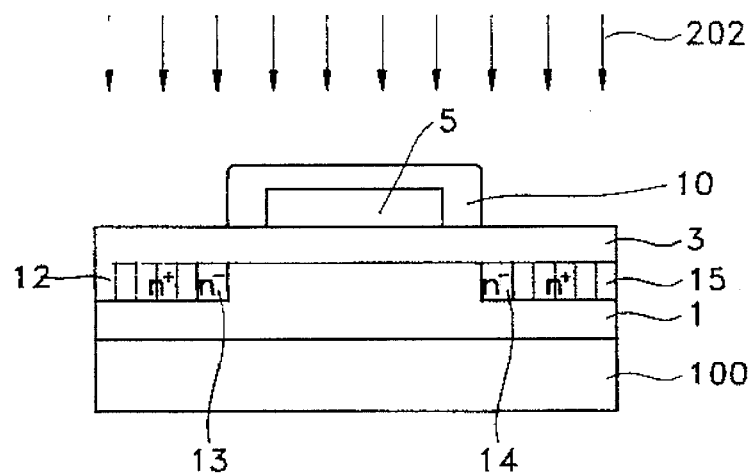

Referring to FIG. 7 showing a step of forming the offset structure through a second ion implantation process, a low concentration ion 202 (n⁻) is implanted so as to form offset regions corresponding to the thickness of metal layer 9 removed in the etching step, thereby completing the device. Thus, a smaller offset width l' is formed, compared to that of the conventional offset.

According to the above-described method, the width of the offset regions can be controlled down to narrow widths below 1 μm, and drain voltage decreased due to this reduction in offset regions' width. Also, the effect of the increase of parallel resistance and a bias voltage dependency of an overlap capacitance due to the arrangement of the low concentration ion regions reduces leakage current and improves the response to applied voltages. Since the increase of parallel resistance and the overlap capacitance are major factors influencing device performance, the method according to the present invention, wherein the width of the offset regions can be formed below 1 μm, is very valuable for use in high-speed circuits composed of devices having narrow offset regions.

Also, an electrical response characteristic, which is a problem of the conventional art, is improved by the present invention. That is, compared with the case where only a polysilicon gate is used, the gate voltage is decreased since the resistance thereof decreases as the polysilicon of the gate is substituted with silicide.

TABLE 1

| metal | atomic volume | silicide | silicon-to-metal thickness ratio | silicide-to-metal thickness ratio |
|---|---|---|---|---|
| Si | 12.06Å | — | — | — |
| Ti | 10.60Å | TiSi$_2$ | 2.27 | 2.51 |
| Zr | 14.05Å | ZrSi$_2$ | 1.72 | 2.14 |
| Hf | 13.63Å | HfSi$_2$ | 1.77 | 2.14 |
| V | 8.35Å | VSi$_2$ | 2.89 | 2.77 |
| Nb | 11.06Å | NbSi$_2$ | 2.18 | 2.39 |
| Ta | 10.90Å | TaSi$_2$ | 2.21 | 2.40 |
| Cr | 7.23Å | CrSi$_2$ | 3.34 | 3.05 |

What is claimed is:

1. A method of manufacturing an offset polysilicon thin-film transistor having a silicide covered polysilicon gate disposed between source and drain regions formed in an active semiconductor layer, comprising the steps of:

forming a polysilicon gate having a first thickness over the active semiconductor layer;

covering the polysilicon gate with a metal layer having a second thickness;

forming the source and drain regions on opposite sides of the metal covered polysilicon gate by implanting a high concentration of ions in the active layer using the metal covered polysilicon gate as a mask;

after forming the source and drain region, heating the metal covered polysilicon gate to form a silicide layer having a third thickness by reaction of the polysilicon gate and the metal layer;

removing a residual portion of the metal layer having a fourth thickness to expose offset regions having a width equal to the fourth thickness; and, implanting a low concentration of ions in the offset regions.

2. The method of manufacturing a polysilicon thin-film transistor according to claim 1, wherein the fourth thickness is less than 1 μm.

3. The method of manufacturing a polysilicon thin-film transistor according to claim 1, wherein the metal layer is formed from a metal selected from the group consisting of Ti, Zr, Hf, V, Nb, Ta, Cr, Mo, Fe, Co, Ni, Pb, and Pt.

4. The method of manufacturing a polysilicon thin-film transistor according to claim 1, wherein the step of forming a metal layer comprises the step of vacuum-evaporating a metal layer over the polysilicon gate.

5. A method of manufacturing a polysilicon thin-film transistor, comprising the steps of:

forming an active layer over a substrate;

forming a gate insulating layer over the active layer;

forming a polysilicon gate over the gate insulating layer;

forming a metal layer over the polysilicon gate to form a metal covered polysilicon gate;

forming source and drain regions in the active layer on opposite sides of the metal covered polysilicon gate by implanting a high concentration of ions in the active layer using the metal covered polysilicon gate as a mask;

after forming the source and drain regions, thermally treating the structure formed by the metal layer overlying the polysilicon gate to form a silicide layer from the polysilicon gate and the metal layer;

removing a residual portion of the metal layer from the silicide layer to form a silicide covered polysilicon gale;

forming offset regions in the active layer between the drain region and one side of the silicide covered polysilicon gate, and between the source region and another side of the silicide covered polysilicon gate by implanting a low concentration of ions in the active layer, such that the offset regions have a width corresponding to the thickness of the residual portion of the metal layer which was removed.

6. The method of manufacturing a polysilicon thin-film transistor according to claim 5, wherein the residual metal layer has a thickness less than 1 μm.

7. The method of manufacturing a polysilicon thin-film transistor according to claim 5, wherein the metal layer is formed from a metal selected from the group consisting of Ti, Zr, Hf, V, Nb, Ta, Cr, Mo, Fe, Co, Ni, Pb, and Pt.

8. The method of manufacturing a polysilicon thin-film transistor according to claim 5, wherein the step of forming a metal layer comprises the step of vacuum-evaporating a metal layer over the polysilicon gate.

* * * * *